(12) United States Patent
Hoshino et al.

(10) Patent No.: US 6,650,117 B2
(45) Date of Patent: Nov. 18, 2003

(54) RF COIL AND MAGNETIC RESONANCE IMAGING SYSTEM

(75) Inventors: Kazuya Hoshino, Tokyo (JP); Kenji Sato, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 79 days.

(21) Appl. No.: 09/811,865

(22) Filed: Mar. 19, 2001

(65) Prior Publication Data

US 2001/0035753 A1 Nov. 1, 2001

(30) Foreign Application Priority Data

Apr. 26, 2000 (JP) .......................... 2000-125489

(51) Int. Cl.$^7$ ................................. G01V 3/00
(52) U.S. Cl. ..................................... 324/318
(58) Field of Search ................ 324/300, 322, 324/318, 307, 309

(56) References Cited

U.S. PATENT DOCUMENTS

| | | | | |
|---|---|---|---|---|
| 4,829,252 A | * | 5/1989 | Kaufman ................ | 324/309 |
| 5,166,619 A | * | 11/1992 | Ries ..................... | 324/318 |
| 5,289,129 A | * | 2/1994 | Joseph .................. | 324/318 |
| 5,386,191 A | * | 1/1995 | McCarten et al. ......... | 324/318 |
| 5,630,415 A | * | 5/1997 | Kaufman ................ | 600/422 |
| 5,874,831 A | * | 2/1999 | Yi et al. ................. | 324/318 |
| 6,249,121 B1 | * | 6/2001 | Boskamp et al. ......... | 324/318 |

FOREIGN PATENT DOCUMENTS

JP 08154914 6/1996

* cited by examiner

*Primary Examiner*—Edward Lefkowitz
*Assistant Examiner*—Dixomara Vargas
(74) *Attorney, Agent, or Firm*—Moonray Kojima

(57) ABSTRACT

With a view toward implementing an RF coil easy to uniformize the strength of a magnetic field, the RF coil is provided with a first current path group of wires including a plurality of linear current passes placed in parallel with one another, a second current pass group of wires placed so as to have the relations in mirror image with respect to the first current pass group, and a third current pass group of wires in which all the linear electrical passes are series-connected so as to be identical in current direction through both groups of the first and second current pass groups while bypassing the first and second current pass groups.

8 Claims, 11 Drawing Sheets

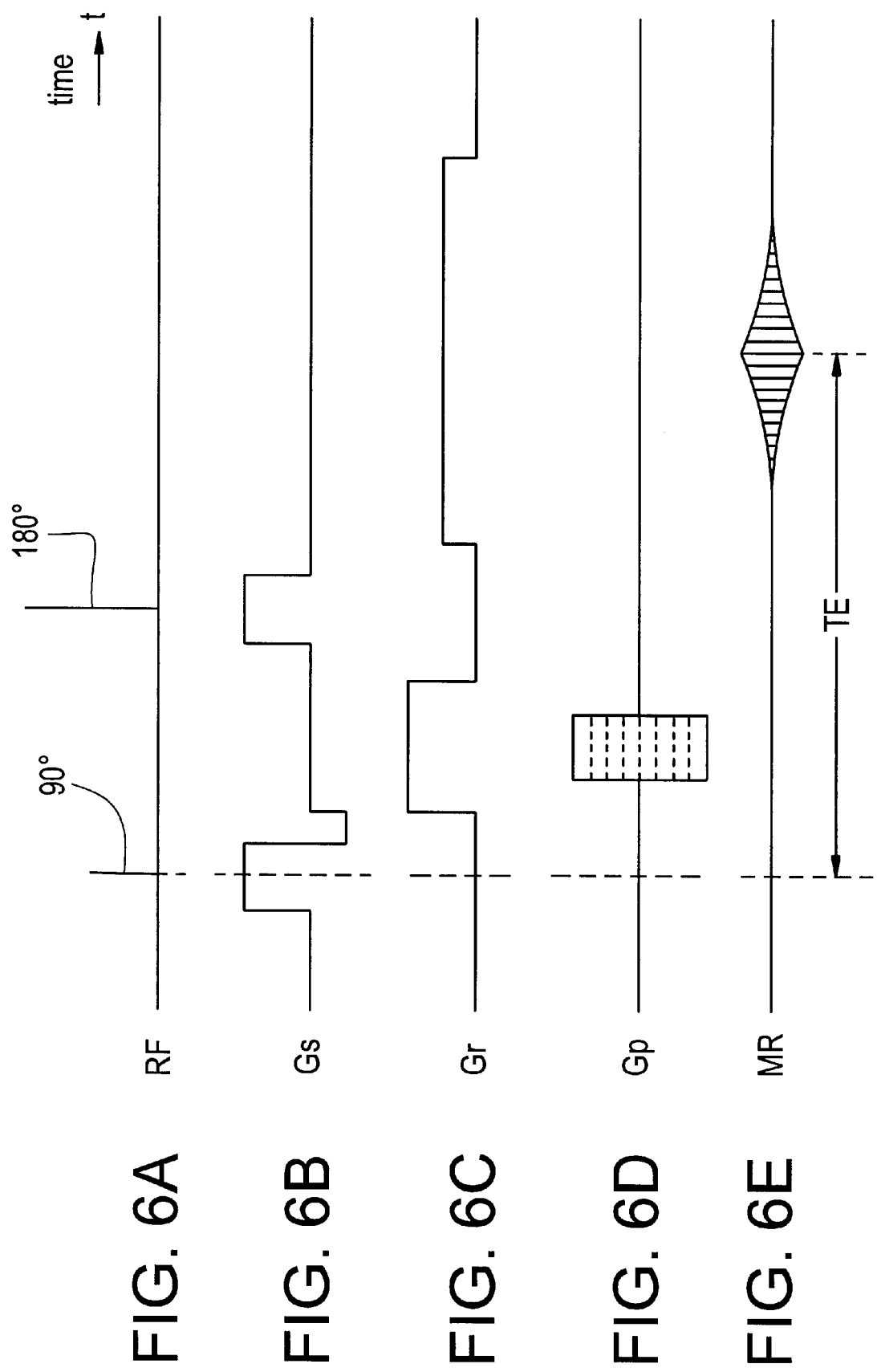

FIG. 7
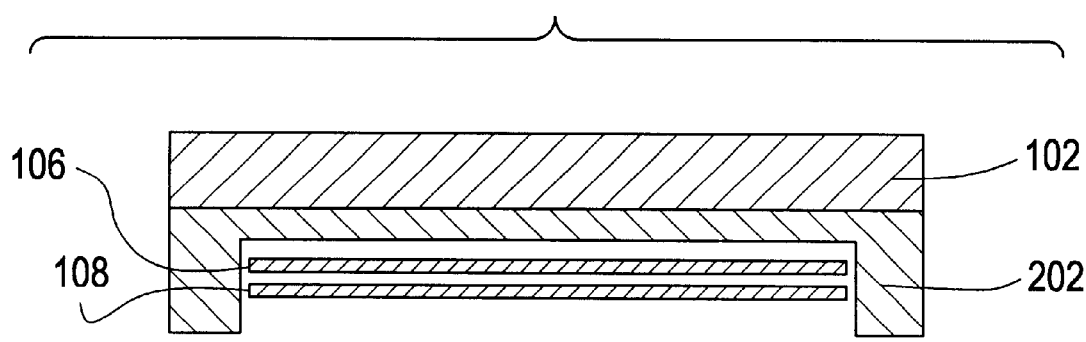
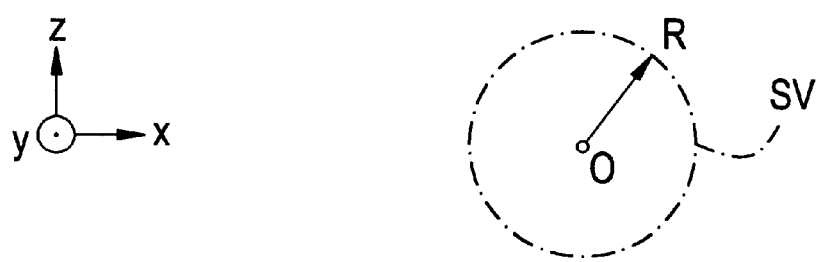
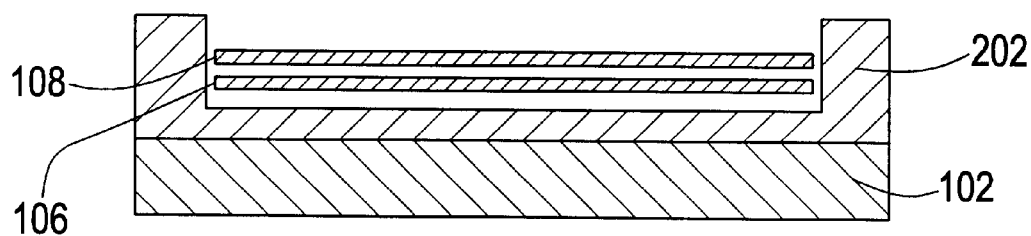

RF COIL AND MAGNETIC RESONANCE IMAGING SYSTEM

BACKGROUND OF THE INVENTION

The present invention relates to an RF coil (radio frequency coil) and a magnetic resonance imaging system, and particularly to a flat type RF coil and a magnetic resonance imaging system having such an RF coil.

In a magnetic resonance imaging (MRI) system, a target to be shot or imaged is carried in an internal bore of a magnet system, i.e., a bore or space in which a static magnetic field is formed. A gradient magnetic field and a high-frequency magnetic field are applied to produce a magnetic resonance signal within the target. A tomogram is produced (reconstructed) based on its received signal.

In a magnet system using permanent magnets for the purpose of generating a static magnetic field, a flat type RF coil is provided close to the pair of permanent magnets opposite to each other to thereby apply a high-frequency magnetic field.

As the flat type RF coil, one is used which has patterns for current passes such as shown in FIG. 1 by way example. As shown in the same drawing, the RF coil has a pair of main passes 26 and return passes 27 which connect these main passes in series so that the directions of currents flowing therethrough become identical.

In order to uniformize the distribution of an intensity distribution of a high-frequency magnetic field in an imaging space or volume, main passes respectively comprise two current passes 26a and 26b and 26a' and 26b' connected in parallel as shown in FIG. 2 by way of example. The two current passes 26a and 26b and 26a' and 26b' are placed in parallel with a predetermined interval held therebetween.

Uniformly or appropriately proportionally-distributed currents are passed through these two current passes 26a and 26b (26a' and 26b') to thereby achieve the uniformization of the intensity distribution of the high-frequency magnetic field. The proportion of the currents is adjusted by selecting values of circuit parts such as capacitors inserted into the passes.

As another technique, as shown in FIG. 3 by way of example, each of main passes 26 is formed of a wide conductor and a high-frequency magnetic field is formed by a distributed current flowing therethrough.

Since each of circuit parts normally has an error allowed for its nominal value from the viewpoint of standards, the ratio in current between the two current passes must accurately be adjusted while the error is being corrected in the RF coil having the configuration shown in FIG. 2, and hence a great deal of working man-hours are required. Further, since an eddy current based on a gradient magnetic field flows in the broad conductor in the RF coil having the configuration shown in FIG. 3, a gradient magnetic field characteristic is degraded.

SUMMARY OF THE INVENTION

Therefore, an object of the present invention is to implement an RF coil easy to uniformize the strength of a magnetic field and a magnetic resonance imaging system having such an RF coil. Further, the implementation of an RF coil free of an eddy current developed due to a gradient magnetic field and a magnetic resonance imaging system having such an RF coil is an object.

(1) The invention according to one aspect, for solving the above problems is an RF coil which comprises a first current pass group including a plurality of linear current passes placed on a plane surface in parallel with one another, a second current pass group which includes a plurality of linear current passes parallel to one another and is placed on the plane surface in such a relationship as to have a mirror image parallel to the first current pass group, and a third current pass group in which all the linear electrical passes are series-connected so as to be identical in current direction through both groups of the first and second current pass groups while bypassing the first and second current pass groups along the plane surface.

In the invention according to the present aspect, all the linear electrical passes are connected in series so that they are identical in current direction through the first and second current pass groups. Therefore, currents for all the linear electrical passes or main passes are rendered identical to one another without any adjustments. Therefore, the uniformity of a high-frequency magnetic field is uniquely determined according to the spatial arrangement of the linear electrical passes.

(2) The invention according to another aspect, for solving the above problems is an RF coil which comprises a first current pass group including a plurality of linear current passes placed on a first plane surface in parallel with one another, a second current pass group which includes a plurality of linear current passes parallel with one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a fourth current pass group including a plurality of linear current passes which are placed on a second plane surface opposed in parallel with the first plane surface with a space interposed therebetween, so as to extend parallel to the direction of the current passes of the first current pass group, a fifth current pass group which includes a plurality of linear current passes parallel with one another and is placed on the second plane surface in such a relationship as to have a mirror image parallel to the fourth current pass group, and a sixth current pass group in which all the linear electrical passes are series-connected so as to be identical in current direction through both groups of the fourth and fifth current pass groups while bypassing the fourth and fifth current pass groups along the second plane surface.

In the invention according to the present aspect, two RF coils each having the same configuration as the RF coil described in (1) are laid out in an opposing relationship with a space defined therebetween. Therefore, a composite high-frequency magnetic field can be, formed between the two.

(3) The invention according to a further aspect, for solving the above problems is an RF coil which comprises a first current pass group including a plurality of linear current passes placed on a first plane surface in parallel with one another, a second current pass group which includes a plurality of linear current passes parallel with one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a seventh current pass group including a plurality of linear current passes which are placed on a third plane surface adjacent to the first plane surface and opposed in parallel therewith, so as to extend parallel to one another along the direction orthogonal to the direction of the current passes of the first current pass group, an eighth current pass group which includes a plurality of linear current passes parallel to one another and is placed on the third plane surface in such a relationship as to have a mirror image parallel to the seventh current pass group, and a ninth current pass group in which all the linear electrical passes are series-connected so as to be identical in current direction through both groups of the seventh and eighth current pass groups while bypassing the seventh and eighth current pass groups along the third plane surface.

In the invention according to the present aspect, two RF coils each having the same configuration as the RF coil described in (1) are combined together so that main passes are made vertical to each other. It is therefore possible to form a high-frequency magnetic field according to a quadrature system.

(4) The invention according to a still further aspect, for solving the above problems is an RF coil which comprises a first current pass group including a plurality of linear current passes placed on a first plane surface in parallel with one another, a second current pass group which includes a plurality of linear current passes parallel with one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a seventh current pass group including a plurality of linear current passes which are placed on a third plane surface adjacent to the first plane surface and opposed in parallel therewith, so as to extend parallel to one another along the direction orthogonal to the direction of the current passes of the first current pass group, an eighth current pass group which includes a plurality of linear current passes parallel to one another and is placed on the third plane surface in such a relationship as to have a mirror image parallel to the seventh current pass group, a ninth current pass group in which all the linear electrical passes are series-connected so as to be identical in current direction through both groups of the seventh and eighth current pass groups while bypassing the seventh and eighth current pass groups along the third plane surface, a fourth current pass group including a plurality of linear current passes which are placed on a second plane surface opposed in parallel with the first plane surface with a space interposed therebetween, so as to extend parallel to the direction of the current passes of the first current pass group, a fifth current pass group which includes a plurality of linear current passes parallel with one another and is placed on the second plane surface in such a relationship as to have a mirror image parallel to the fourth current pass group, a sixth current pass group in which all the linear electrical passes are series-connected so as to be identical in current direction through both groups of the fourth and fifth current pass groups while bypassing the fourth and fifth current pass groups along the second plane surface, a tenth current pass group including a plurality of linear current passes which are placed on a fourth plane surface adjacent to the second plane surface and opposed in parallel therewith, so as to extend parallel to one another along the direction orthogonal to the direction of the current passes of the fourth current pass group, an eleventh current pass group which includes a plurality of linear current passes parallel to one another and is placed on the fourth plane surface in such a relationship as to have a mirror image parallel to the tenth current pass group, and a twelfth current pass group in which all the linear electrical passes are series-connected so as to be identical in current direction through both groups of the tenth and eleventh current pass groups while bypassing the tenth and eleventh current pass groups along the fourth plane surface.

In the invention according to the present aspect, two quadrature type RF coils each having the same configuration as the RF coil described in (3) are placed in an opposing relationship with a space defined therebetween. It is therefore possible to form a composite high-frequency magnetic field in the space defined therebetween.

(5) The invention according to a still further aspect, for achieving the above problems is a magnetic resonance imaging system for forming an image, based on magnetic resonance signals acquired using a static magnetic filed, a gradient magnetic field and a high-frequency magnetic field, which comprises an RF coil for generating the high-frequency magnetic field, including a first current pass group including a plurality of linear current passes placed on a plane surface in parallel with one another, a second current pass group which includes a plurality of linear current passes parallel to one another and is placed on the plane surface in such a relationship as to have a mirror image parallel to the first current pass group, and a third current pass group in which all the linear electrical passes are series-connected so as to be identical in current direction through both groups of the first and second current pass groups while bypassing the first and second current pass groups along the plane surface.

In the invention according to the present aspect, as an RF coil for the generation of a high-frequency magnetic field, one is used wherein all the linear electrical passes are series-connected so as to become identical in current direction through the first and second current pass groups, and currents flowing through all the linear electrical passes, i.e., main passes are rendered identical without any adjustments. Therefore, the uniformity of a high-frequency magnetic field is uniquely determined according to the spatial arrangement of the linear electrical passes.

(6) The invention according to a still further aspect, for solving the above problems is a magnetic resonance imaging system for forming an image, based on magnetic resonance signals acquired using a static magnetic filed, a gradient magnetic field and a high-frequency magnetic field, which comprises an RF coil for generating the high-frequency magnetic field, including a first current pass group including a plurality of linear current passes placed on a first plane surface in parallel with one another, a second current pass group which includes a plurality of linear current passes parallel to one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a fourth current pass group including a plurality of linear current passes which are placed on a second plane surface opposed in parallel with the first plane surface with a space interposed therebetween, so as to extend parallel to the direction of the current passes of the first current pass group, a fifth current pass group which includes a plurality of linear current passes parallel with one another and is placed on the second plane surface in such a relationship as to have a mirror image parallel to the fourth current pass group; and a sixth current pass group in which all the linear electrical passes are series-connected so as to be identical in current direction through both groups of the fourth and fifth current pass groups while bypassing the fourth and fifth current pass groups along the second plane surface.

In the invention according to the present aspect, as RF coils for the generation of high-frequency magnetic fields, ones are used wherein two RF coils each having the same configuration as the RF coil described in (1) are placed in an opposing relationship with a space defined therebetween. It is therefore possible to form a composite high-frequency magnetic field in the space defined therebetween.

(7) The invention according to a still further aspect, for solving the above problems is a magnetic resonance imaging system for forming an image, based on magnetic resonance signals acquired using a static magnetic filed, a gradient magnetic field and a high-frequency magnetic field, which comprises an RF coil for generating the high-frequency magnetic field, including a first current pass group including a plurality of linear current passes placed on a first plane surface in parallel with one another, a second current pass group which includes a plurality of linear current passes parallel with one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a seventh current pass group including a plurality of linear current passes which are placed on a third plane surface adjacent to the first plane surface and opposed in parallel therewith, so as to extend parallel to one another along the direction orthogonal to the direction of the current passes of the first current pass group, an eighth current pass group which includes a plurality of linear current passes parallel to one another and is placed on the third plane surface in such a relationship as to have a mirror image parallel to the seventh current pass group, and a ninth current pass group in which all the linear electrical passes are series-connected so as to be identical in current direction through both groups of the seventh and eighth current pass groups while bypassing seventh and eighth current pass groups along the third plane surface.

In the invention according to the present aspect, as an RF coil for the generation of a high-frequency magnetic field, one, is used wherein two RF coils each having the same configuration as the RF coil described in (1) are combined together so that main passes are made vertical to each other. It is therefore possible to form a high-frequency magnetic field according to a quadrature system.

(8) The invention according to a still further aspect, for solving the above problems is a magnetic resonance imaging system for forming an image, based on magnetic resonance signals acquired using a static magnetic filed, a gradient magnetic field and a high-frequency magnetic field, which comprises an RF coil for generating the high-frequency magnetic field, including a first current pass group including a plurality of linear current passes placed on a first plane surface in parallel with one another, a second current pass group which includes a plurality of linear current passes parallel with one another and is placed on the first plane surface in such a relationship as to have a mirror image parallel to the first current pass group, a third current pass group in which all the linear electrical passes are series-connected so as to be identical in current direction through both groups of the first and second current pass groups while bypassing the first and second current pass groups along the first plane surface, a seventh current pass group including a plurality of linear current passes which are placed on a third plane surface adjacent to the first plane surface and opposed in parallel therewith, so as to extend parallel to one another along the direction orthogonal to the direction of the current passes of the first current pass group, an eighth current pass group which includes a plurality of linear current passes parallel to one another and is placed on the third plane surface in such a relationship as to have a mirror image parallel to the seventh current pass group, a ninth current pass group in which all the linear electrical passes are series-connected so as to be identical in current direction through both groups of the seventh and eighth current pass groups while bypassing the seventh and eighth current pass groups along the third plane surface, a fourth current pass group including a plurality of linear current passes which are placed on a second plane surface opposed in parallel with the first plane surface with a space interposed therebetween, so as to extend parallel to the direction of the current passes of the first current pass group, a fifth current pass group which includes a plurality of linear current passes parallel with one another and is placed on the second plane surface in such a relationship as to have a mirror image parallel to the fourth current pass group, a sixth current pass group in which all the linear electrical passes are series-connected so as to be identical in current direction through both groups of the fourth and fifth current pass groups while bypassing the fourth and fifth current pass groups along the second plane surface, a tenth current pass group including a plurality of linear current passes which are placed on a fourth plane surface adjacent to the second plane surface and opposed in parallel therewith, so as to extend parallel to one another along the direction orthogonal to the direction of the current passes of the fourth current pass group, an eleventh current pass group which includes a plurality of linear current passes parallel to one another and is placed on the fourth plane surface in such a relationship as to have a mirror image parallel to the tenth current pass group, and a twelfth current pass group in which all the linear electrical passes are series-connected so as to be identical in current direction through both groups of the tenth and eleventh current pass groups while bypassing the tenth and eleventh current pass groups along the fourth plane surface.

In the invention according to the present aspect, as RF coils for the generation of high-frequency magnetic fields, ones are used wherein two quadrature type RF coils each having the same configuration as the RF coil described in (3) are placed in an opposing relationship with a space defined therebetween. It is therefore possible to form a composite high-frequency magnetic field in the space defined therebetween.

According to the present invention, an RF coil easy to uniformize the strength of a magnetic field and a magnetic resonance imaging system having such an RF coil can be implemented. Further, an RF coil which does not cause eddy currents due to a gradient magnetic field, and a magnetic resonance imaging system having such an RF coil can be implemented.

Further objects and advantages of the present invention will be apparent from the following description of the preferred embodiments of the invention as illustrated in the accompanying drawings.

BRIEF DESCRIPTION OF THE DRAWINGS

FIGS. 6A–6E are diagrams illustrating one example of a pulse sequence executed by the system shown in FIG. 4.

FIG. 7 is a typical diagram depicting the structure of a magnet system employed in the system shown in FIG. 4 in the neighborhood of each transmission coil unit thereof.

DETAILED DESCRIPTION OF THE INVENTION

Figure 4:
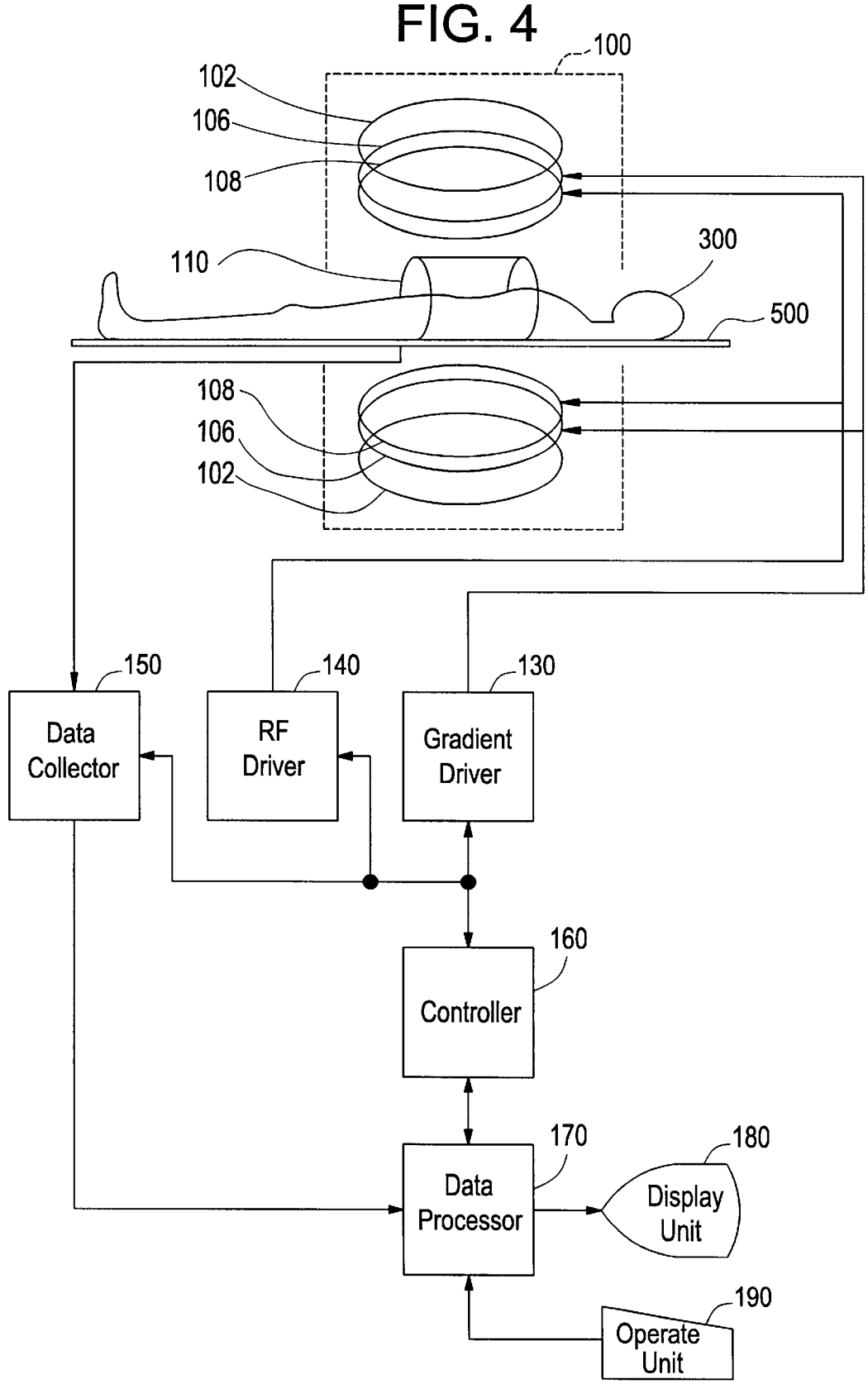
FIG. 4 is a block diagram of a system showing one example of an embodiment according to the present invention.

Preferred embodiments of the present invention will hereinafter be described in detail with reference to the accompanying drawings. A block diagram of a magnetic resonance imaging system is shown in FIG. 4. The present system is one example of an embodiment of the present invention. One example of an embodiment related to a system of the present invention is shown according to the configuration of the present system.

As shown in FIG. 4, the present system has a magnetic system 100. The magnetic system 100 has main magnetic field magnet units 102, gradient coil units 106 and transmission coil units 108. Any of these main magnetic field magnet unit 102 and respective coil units comprises, paired ones opposed to one another with a space, interposed therebetween. Further, any of them has a substantially disc shape and is placed with its central axis held in common. A target 300 is placed on a cradle 500 in an internal bore of the magnetic system 100 and carried in and out by unillustrated conveying means. A receiving coil unit 110 is mounted to a shot or imaged portion of the target 300.

The main magnetic field magnet unit 102 forms a static magnetic field in the internal bore of the magnetic system 100. The direction of the static magnetic field is approximately orthogonal to the direction of the body axis of the target 300. Namely, the main magnetic field magnet unit 102 forms a so-called vertical magnetic field. The main magnetic field magnet unit 102 is configured using a permanent magnet or the like, for example. Incidentally, the main magnetic field magnet unit 102 is not limited to the permanent magnet and may of course be configured using a superconductive electromagnet or a normal conductive electromagnet or the like.

The gradient coil unit 106 produces gradient magnetic fields used for causing the intensity of the static magnetic field to have a gradient or slope. The produced gradient magnetic fields include three types of gradient magnetic fields of a slice gradient magnetic field, a read out gradient magnetic field and a phase encode gradient magnetic field. The gradient coil unit 106 has unillustrated 3-systematic gradient coils in association with these three types of gradient magnetic fields.

The three-systematic gradient coils respectively produce three gradient magnetic fields for applying gradients to static magnetic fields respectively as viewed in three directions orthagonal to one another. One of the three directions corresponds to the direction (vertical direction) of the static magnetic field and is normally defined as a z direction. Another one thereof corresponds to a horizontal direction and is normally defined as a y direction. The remaining one corresponds to the direction orthogonal to the z and y directions and is normally defined as an x direction. The x direction is orthogonal to the z direction within the vertical plane and perpendicular to the y direction within the horizontal plane. x, y and z are also called gradient axes below.

Any of x, y and z can be set as an axis for a slice gradient. When any of them is set as the slice gradient axis, one of the remaining two is set as an axis for a phase encode gradient and the other thereof is set as an axis for a read out gradient. The 3-systematic gradient coils will further be explained later.

The transmission coil unit 108 transmits an RF excitation signal for exciting a spin in a body of the target 300 to a static magnetic field space. The transmission coil unit 108 is one example of an embodiment of an RF coil employed in the present invention. One example of the embodiment related to the RF coil employed in the present invention is shown based on the configuration of the transmission coil unit 108. The transmission coil unit 108 will further be described later.

A gradient driver 130 is connected to the gradient coil unit 106. The gradient driver 130 supplies a drive signal to the gradient coil unit 106 to generate a gradient magnetic field. The gradient driver 130 has unillustrated 3-systematic drive circuits in association with the 3-systematic gradient coils in the gradient coil unit 106.

An RF driver 140 is connected to the RF coil unit 108. The RF driver supplies a drive signal to the transmission coil unit 108 to transmit an RF excitation signal, thereby exciting the spin in the body of the target 300.

The receiving coil unit 110 receives therein a magnetic resonance signal by which the excited spin is produced. A data collector 150 is connected to the receiving coil unit 110.

The data collector 150 takes in or captures a signal received by the receiving coil unit 110 and collects it as view data.

A controller 160 is connected to the gradient driver 130, the RF driver 140 and the data collector 150. The controller 160 controls the gradient driver 130 to data collector 150 respectively to execute shooting or imaging.

The output side of the data collector 150 is connected to a data processor 170. The data processor 170 is configured using a computer or the like, for example. The data processor 170 has an unillustrated memory. The memory stores a program and various data for the data processor 170 therein. The function of the present system is implemented by allowing the data processor 170 to execute the program stored in the memory.

The data processor 170 causes the memory to store the data captured from the data collector 150. A data space is defined in the memory. The data space forms a two-dimensional Fourier space. The data processor 170 transforms these data in the two-dimensional Fourier space into two-dimensional inverse Fourier form to thereby produce (reconstruct) an image for the target 300. The two-dimensional Fourier space is also called a "k space".

The data processor 170 is connected to the controller 160. The data processor 170 is above the controller 160 in rank and generally controls it. Further, a display unit 180 and an operation or control unit 190 are connected to the data processor 170. The display unit 180 is made up of a graphic display or the like. The operation unit 190 comprises a keyboard or the like provided with a pointing device.

The display unit 180 displays a reconstructed image and various information outputted from the data processor 170. The operation unit 190 is operated by an operator and inputs various commands and information or the like to the data processor 170. The operator controls the present system on an interactive basis through the display unit 180 and the operation unit 190.

FIGS. 5A–5E show one example of a pulse sequence used when imaging or shooting is done by the present, system. The present pulse sequence corresponds to a pulse sequence of a gradient echo (GRE) method.

Figures 5A, 5B, 5C, 5D, 5E:
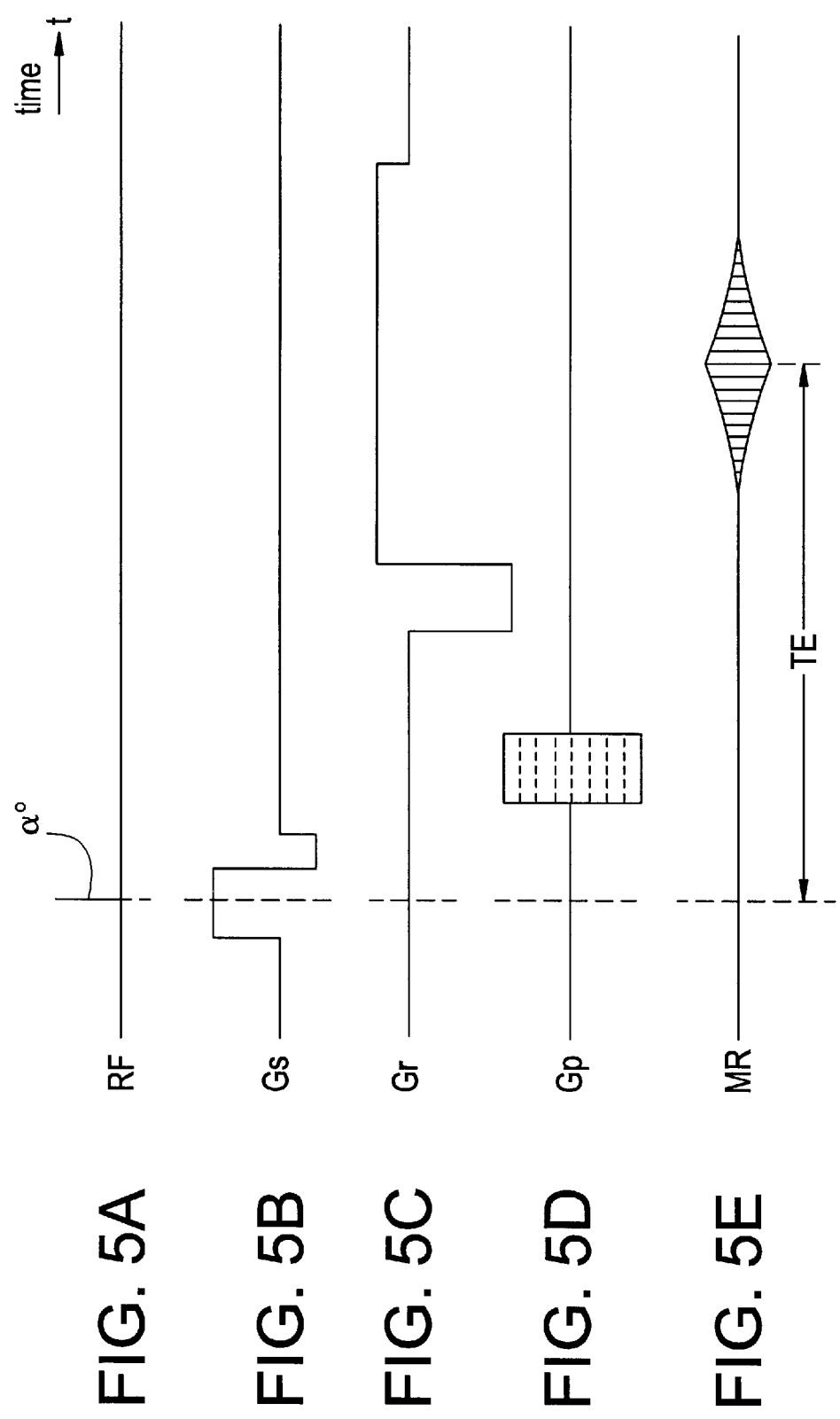
FIGS. 5A–5E are diagrams showing one example of a pulse sequence executed by the system shown in FIG. 4.

FIG. 5A shows a sequence of a α° pulse for RF excitation employed in the GRE method. FIGS. 5B–5E similarly respectively show sequences of a slice gradient Gs, a read out gradient Gr, a phase encode gradient Gp and a gradient echo MR. Incidentally, the α° pulse is typified by a central signal. The pulse sequence proceeds from left to right along a time axis t.

As shown in the same drawing, α° excitation for the spin is carried out based on the α° pulse. A flip angle α° is less than or equal to 90°. At this time, the slice gradient Gs is applied to effect selective excitation on a predetermined slice.

After the α° excitation, the spin is phase-encoded based on the phase encode gradient Gp. Next, the spin is firstly dephased based on the read out gradient Gr. Next, the spin is rephased to generate a gradient echo MR. The signal strength of the gradient echo MR reaches a maximum after an echo time TE has elapsed since the excitation. The gradient echo MR is collected as view data by the data collector 150.

Such a pulse sequence is repeated 64 to 512 times in a cycle TR (repetition time). Each time it is repeated, the phase encode gradient Gp is changed and different phase encodes are carried out every time. Thus, view data for 64 to 512 views for filing in a k space can be obtained.

Another example of a pulse sequence for magnetic resonance imaging is shown in FIGS. 6A–6E. The pulse sequence corresponds to a pulse sequence of a spin echo (SE) method.

FIG. 6A shows a sequence of a 90° pulse and a 180° pulse for RF excitation employed in the SE method. FIGS. 6B–6E similarly respectively show sequences of a slice gradient Gs, a read out gradient Gr, a phase encode gradient Gp and a spin echo MR. Incidentally, the 90° pulse and 180° pulse are respectively typified by central signals. The pulse sequence proceeds from left to right along a time axis t.

As shown in the same drawing, 90° excitation for the spin is carried out based on the 90° pulse. At this time, the slice gradient Gs is applied to effect selective excitation on a predetermined slice. After a predetermined has elapsed since the 90° excitation, 180° excitation based on the 180° pulse, i.e., spin inversion is carried out. Even at this time, the slice gradient Gs is applied to effect selective inversion on the same slice.

The read out gradient Gr and the phase encode gradient Gp are applied during a period in which the 90° excitation and the spin reversal are carried out. The spin is dephased based on the read out gradient Gr. Further, the spin is phase-encoded based on the phase encode gradient Gp.

After the spin reversal, the spin is rephased based on the read out gradient Gr to produce a spin echo MR. The signal strength of the spin echo MR reaches a maximum after TE has elapsed since the 90° excitation. The spin echo MR is collected as view data by the data collector 150. Such a pulse, sequence is repeated 64 to 512 times in a cycle TR. Each time it is repeated, the phase encode gradient Gp is changed and different phase encodes are carried out every time. Thus, view data for 64 to 512 views for filling in a k space can be obtained.

Incidentally, the pulse sequence used for imaging is not limited to the GRE method or SE method. The pulse sequence may be other suitable techniques such as an FSE (Fast Spin Echo) method, a fast recovery FSE (Fast Recovery Fast Spin Echo) method, echo planar imaging (EPI), etc.

The data processor 170 transforms the view data in the k space into two-dimensional inverse Fourier form to thereby reconstruct a tomogram for the target 300. The reconstructed image is stored in its corresponding memory and displayed on the display unit 180.

FIG. 7 typically shows the structure of the magnet system located in the neighborhood of the transmission coil unit 108 in the form of a cross-sectional view. In the same drawing, O indicates the center of a static magnetic field, i.e., a magnet center, and x, y arid z indicate the aforementioned three directions respectively.

A spheric volume SV of a radius R with the magnet center O as the center is a shooting or imaging area. The magnet system is configured so that the static magnetic field and gradient magnetic field have a predetermined accuracy in the SV.

A pair of main magnetic field magnet units 102 has a pair of pole pieces 202 opposed to each other. The pole piece 202 is composed of a magnetic material having high permeability such as a soft iron or the like and serves so as to uniformize a magnetic flux distribution in a static magnetic field spaces The pole pieces 202 are respectively shaped substantially in the form of discs but protrude in the direction (z direction) in which their peripheral edge portions are orthogonal to their plate surfaces, i.e., in the direction in which the pole pieces 202 are opposed to each other. Thus, the pole pieces 202 have bottom plate portions and protruded peripheral edge portions. The protruded peripheral edge portions serve so as to make up for reductions in magnetic flux density at the peripheral edges of the pole pieces 202.

The gradient coil units 106 and transmission coil units 108 are respectively provided in their corresponding concave portions of the pole pieces 202, which are defined inside the protruded peripheral edge portions. Any of the respective coil units is shaped in the form of a substantially disc. The coil units are mounted to their corresponding polar surfaces of the pole pieces 202 so as to successively form layers by unillustrated appropriate mounting means.

Figure 8:
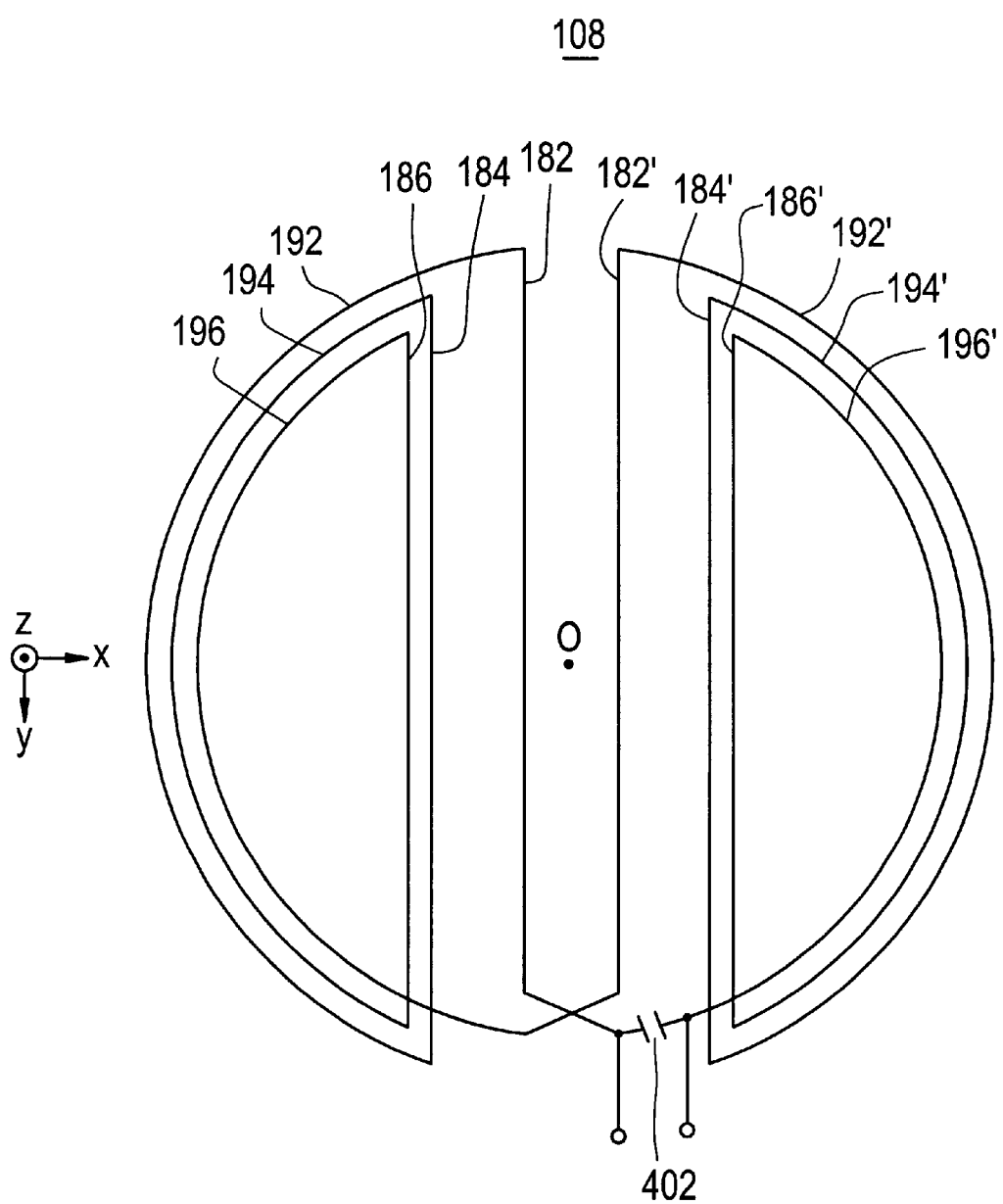
FIG. 8 is a schematic illustration showing patterns of current passes for the transmission coil unit shown in FIG. 7.

Patterns for current passes of the transmission coil unit 108 are shown in FIG. 8 by a diagrammatic illustration. As shown in the same drawing, the transmission coil unit 108 has linear plural main current passes (main passes) 182, 184, 186, 182', 184' and 186' parallel to a y direction at a portion near the center O of a circle. The main pass 182 is closest to the center O. The main passes 184 and 186 are successively kept away from the center O. The main passes 182', 184' and 186' are similar to the above.

The main passes 182, 184 and 186 show one example illustrative of an embodiment of a first current pass group employed in the present invention. The main passes 182', 184' and 186' show one example illustrative of an embodiment of a second current pass group employed in the present invention.

The main passes 182, 184 and 186 and the main passes 182', 184' and 186' have the relations in mirror images with respect to a y axis which passes through the center O of the circle within an xy plane. While an example illustrative of a total of six main passes provided by three is shown herein, the number of main passes may be an appropriate even number corresponding to four or more.

Return passes 192, 194, 196, 192', 194' and 196' for the main passes are formed along the circumference of the circle. The return passes 192, 194, 196, 192', 194' and 196' show one example illustrative of an embodiment of a third current pass group employed in the present invention.

The return pass 192 connects the main passes 182 and 184 to each other in series so that they are identical in current direction. The return pass 194 connects the main passes 184 and 186 to each other in series so that they are identical in current direction. The return pass 196 connects the main passes 186 and 182' to each other in series so that they are identical in current direction.

The return pass 192' connects the main passes 182' and 184' to each other in series in such a manner that they are identical in current direction. The return pass 194' connects the main passes 184' and 186 to each other in series in such a way that they are identical in current direction. The return pass 196' connects the main passes 186' and 182 to each other in series in such a manner that they are identical in current direction.

A capacitor 402 is connected in series with the return pass 192' and constitutes an LC circuit together with the main passes 182 through 186' and return passes 192 through 196'. The resonance frequency of the LC circuit is tuned to a magnetic resonance frequency. An RF drive signal is supplied from the RF driver 140 to both ends of the capacitor 402.

Incidentally, a tuning capacitor may be series-connected to an appropriate one point or plural points of the main passes 182 through 186' and return passes 192 through 196' in addition to the capacitor 402.

The main passes 182, 184, 186, 182', 184' and 186' are all connected in series through the return passes 192, 194, 196, 192', 194' and 196' in such a manner that they are identical in current direction. Thus, the values of currents, which flow through the main passes 182, 184, 186, 182', 184' and 186', are all identical to one another without the need for any adjustment.

An intensity or strength distribution of a high-frequency magnetic field in an imaging or shooting space is determined according to the placement or layout of the main passes 182 through 186' on an xy plane. The layout of the main passes 182 through 186' for uniformizing the intensity distribution of the high-frequency magnetic field or bringing the high-frequency magnetic field to a desired distributed state can be determined by calculation.

One example of the layout of the main passes 182 through 186' takes such a form that the two main passes 184 and 186 (184' and 186') relatively far away from the center O, of the three main passes are disposed so as to approach each other as shown in the drawing.

Figure 1:
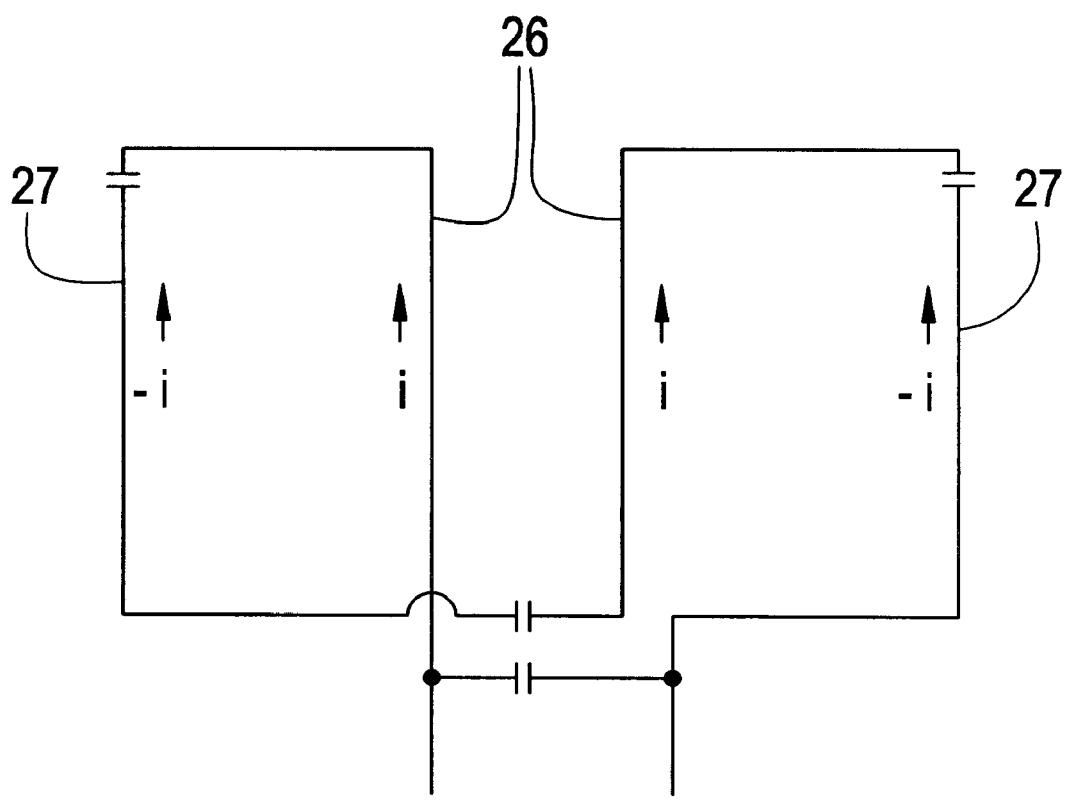
FIG. 1 is a schematic illustration depicting patterns of current passes for a conventional example illustrative of a transmission coil.
Figure 2:
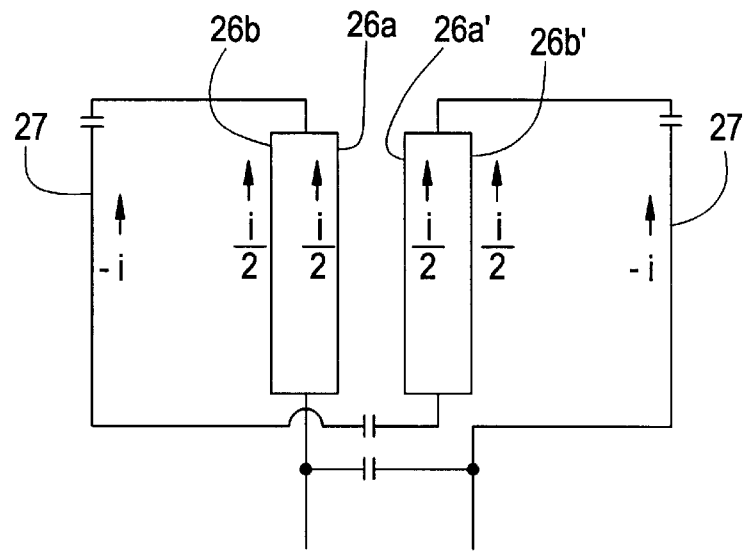
FIG. 2 is a schematic illustration showing patterns of current passes for a conventional example illustrative of a transmission coil.

Thereby, the main passes 184 and 186 (184' and 186') exerts operation similar to the flowing of double currents through the single main pass on a shooting or imaging space. This would substantially lead to the fact that currents are proportionally distributed to the two main passes 26a and 26b at a ratio of 1:2 in the conventional RF coil shown in FIG. 2. Namely, the substantial current distribution can accurately be carried out without depending on values of circuit parts or the like in the present coil. Since it is unnecessary to use a wide conductor for each main pass, eddy currents developed due to a gradient magnetic field present no problem.

By connecting all the passes in series, the length of a conductor constituting each pass increases and the inductance of the coil becomes large. Therefore, one small in capacitance can be used for the tuning capacitor 402. Further, when a magnetic resonance signal is received by the receiving coil unit 110, a blocking impedance for bringing the transmission coil unit 108 to a disable state can be increased.

Figure 3:
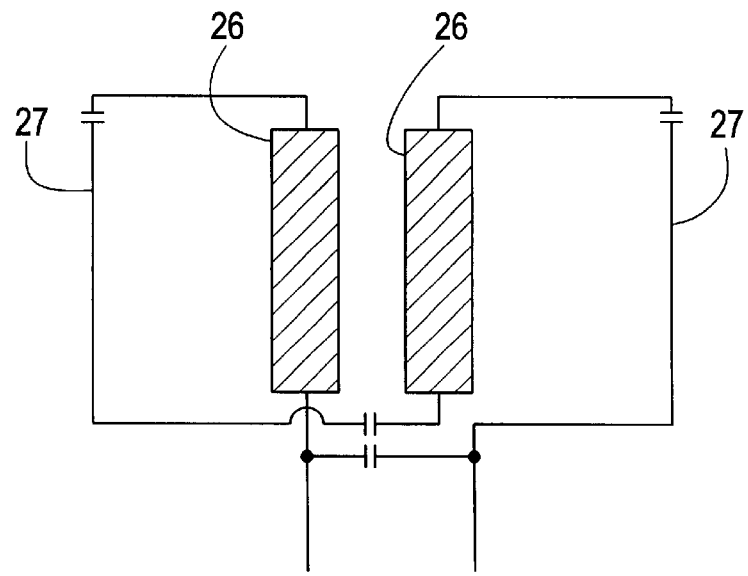
FIG. 3 is a schematic illustration depicting patterns of current passes for a conventional example illustrative of a transmission coil.

Further, since the currents flow through all the main passes in series, a magnetomotive force increases in proportional to the number of the main passes. Therefore, the field intensity per power to be supplied increases as compared with the conventional RF coil shown in FIG. 2 or 3. On the contrary, required power for carrying out the achievement of the same magnetic field strength can be reduced.

Figure 9:
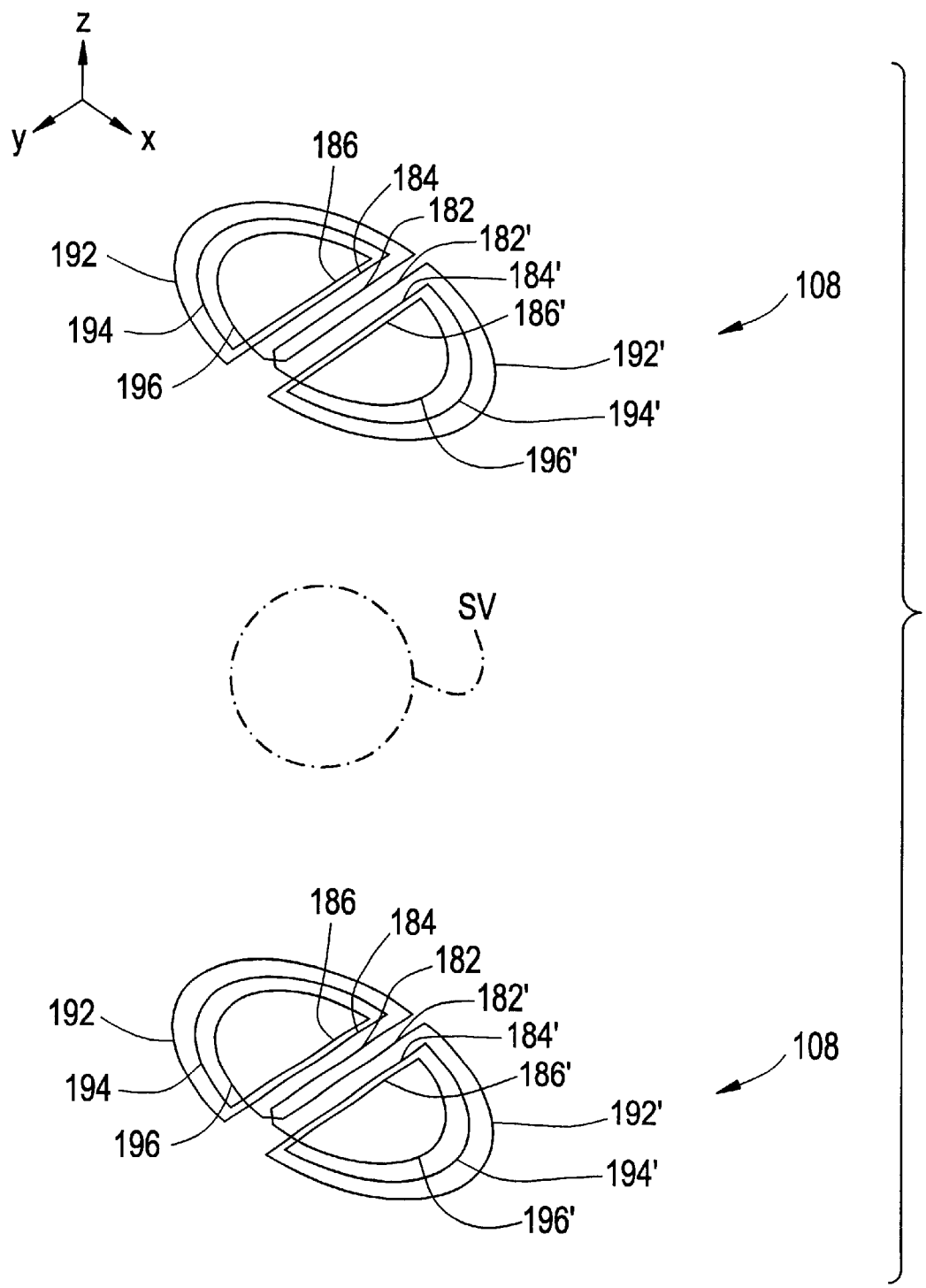
FIG. 9 is a schematic illustration depicting patterns of current passes for the transmission coil units shown in FIG. 7.

As shown in FIG. 9, a pair of transmission coil units 108 having such coil patterns is opposed to each other with a shooting or spheric space or volume SV interposed therebetween. The pair of transmission coil units 108 is supplied with drive signals opposite in phase to each other. Thus, the sum of high-frequency magnetic fields developed in the pair of transmission coil units 108 is applied to the shooting volume SV.

Main passes 182, 184 and 186 for one of the pair of transmission coil units 108 show one example illustrative of an embodiment of a first current pass group employed in the present invention, main passes 182', 184' and 186' for one thereof show one example illustrative of an embodiment of a second current pass group employed in the present invention, and return passes 192, 194, 196, 192', 194' and 196' for one thereof show one example illustrative of an embodiment of a third current pass group employed in the present invention.

Main passes 182, 184 and 186 for the other of the pair of transmission coil units 108 show one example illustrative of an embodiment of a fourth current pass group employed in the present invention, main passes 182', 184' and 186' for the other thereof show one example illustrative of an embodiment of a fifth current pass group employed in the present invention, and return passes 192, 194, 196, 192', 194' and 196' for the other thereof show one example illustrative of an embodiment of a sixth current pass group employed in the present invention.

Figure 10:
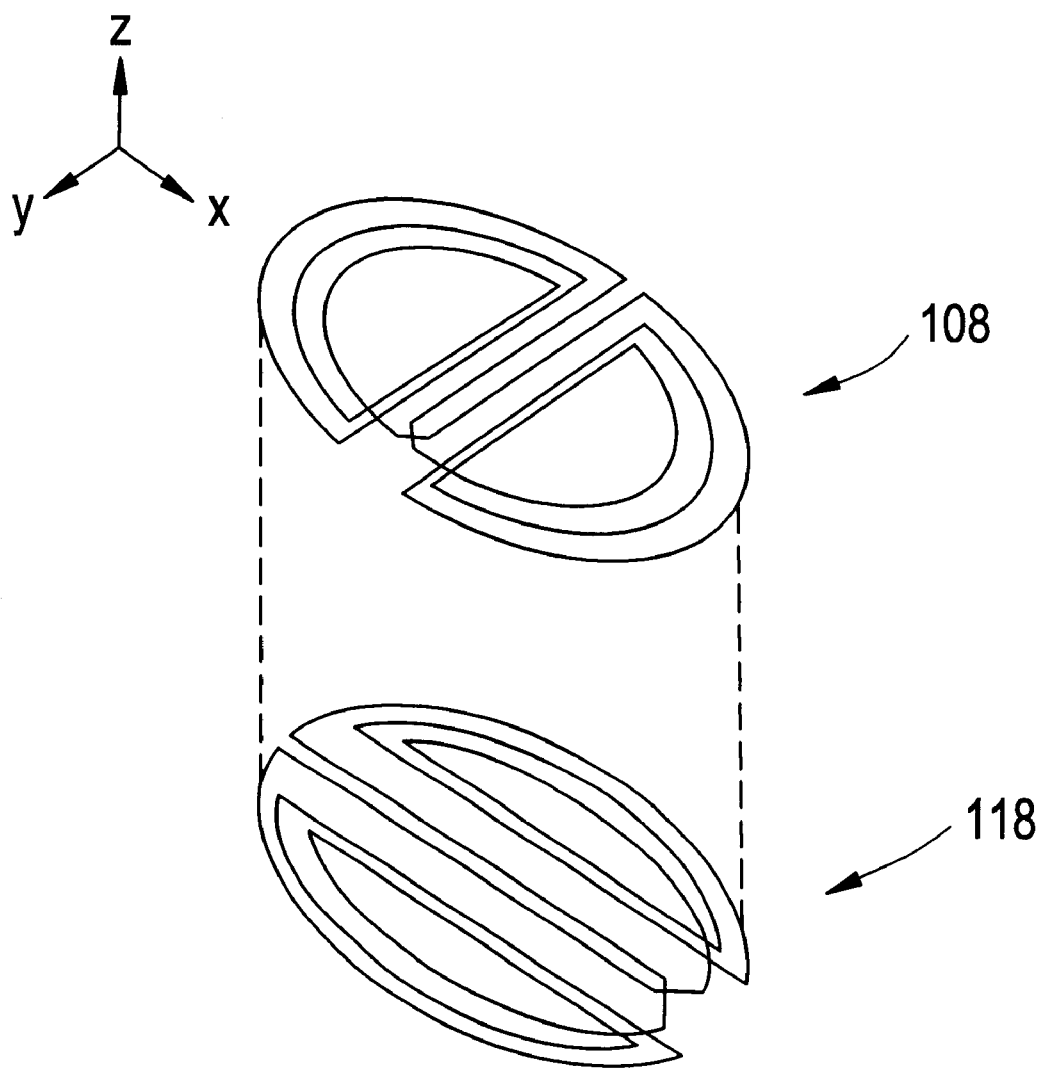
FIG. 10 is a schematic illustration showing patterns of current passes for the transmission coil units shown in FIG. 7.

As shown in FIG. 10 by way of example, a transmission coil unit 118 having coil patterns rendered different in main-pass direction by 90° within an xy plane may be superimposed on the transmission coil unit 108. It is needless to say that the two should be isolated from each other.

Figure 11:
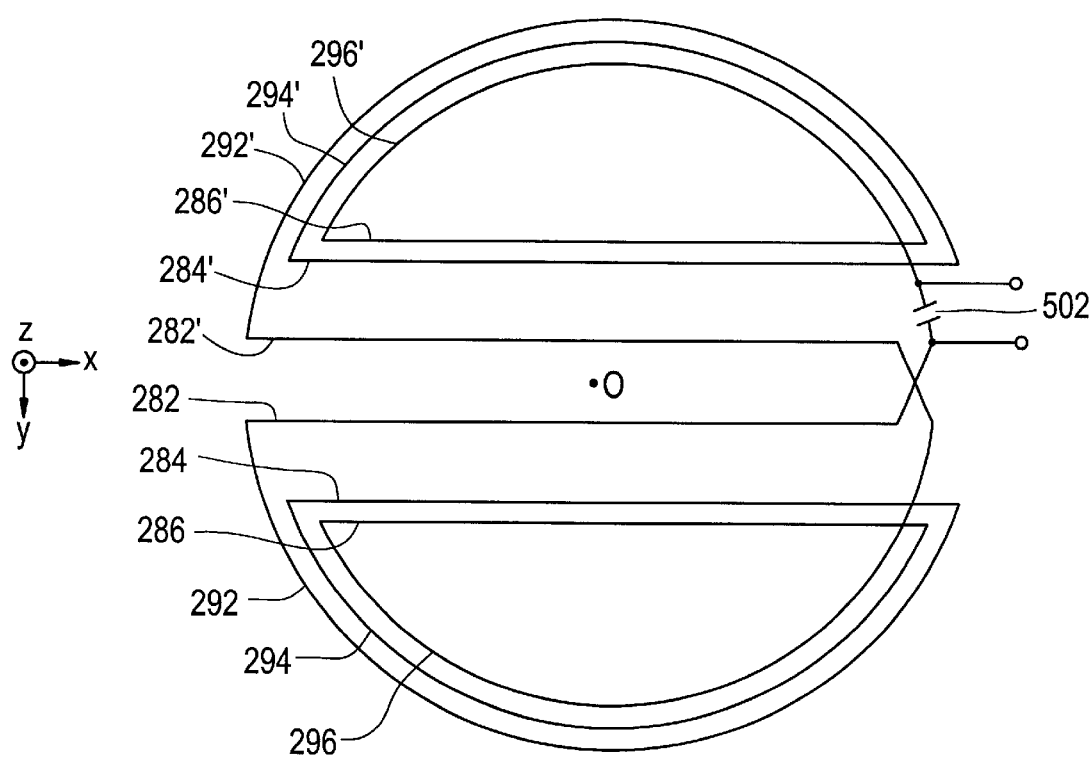
FIG. 11 is a schematic illustration depicting patterns of current passes for the transmission coil unit shown in FIG. 7.

A coil pattern of the transmission coil unit 118 is shown in FIG. 11. As shown in the same drawing, the transmission coil unit 118 is equivalent to one obtained by turning the coil pattern shown in FIG. 8 by 90°.

If described ex integro, then the transmission coil unit 118 has linear plural main passes 282, 284, 286, 282', 284' and 286' parallel in an x direction at a portion near the center O of a circle. The main pass 282 is closest to the center O. The main passes 284 and 286 are successively kept away from the center O. The main passes 282', 284' and 286' are similar to the above.

The main passes 282, 284 and 286 show one example illustrative of an embodiment of a seventh current pass group employed in the present invention. The main passes 282', 284' and 286' show one example illustrative of an embodiment of an eighth current pass group employed in the present invention.

Return passes 292, 294, 296, 292', 294' and 296' are formed along the circumference of the circle. The return passes 292, 294, 296, 292', 294' and 296' show one example illustrative of an embodiment of a ninth current pass group employed in the present invention.

The return pass 292 connects the main passes 282 and 284 to each other in series so that they are identical in current direction. The return pass 294 connects the main passes 284 and 286 to each other in series so that they are identical in current direction. The return pass 296 connects the main passes 286 and 282' to each other in series so that they are identical in current direction.

The return pass 292' connects the main passes 282' and 284' to each other in series in such a manner that they are identical in current direction. The return pass 294' connects the main passes 284' and 286 to each other in series in such a way that they are identical in current direction. The return pass 296' connects the main passes 286' and 282 to each other in series in such a manner that they are identical in current direction.

A capacitor 502 is connected in series with the return pass 292' and constitutes an LC circuit together with the main passes 282 through 286' and return passes 292 through 296' The resonance frequency of the LC circuit is tuned to a magnetic resonance frequency. An RF drive signal is supplied from the RE driver 140 to both ends of the capacitor 502.

Figure 12:
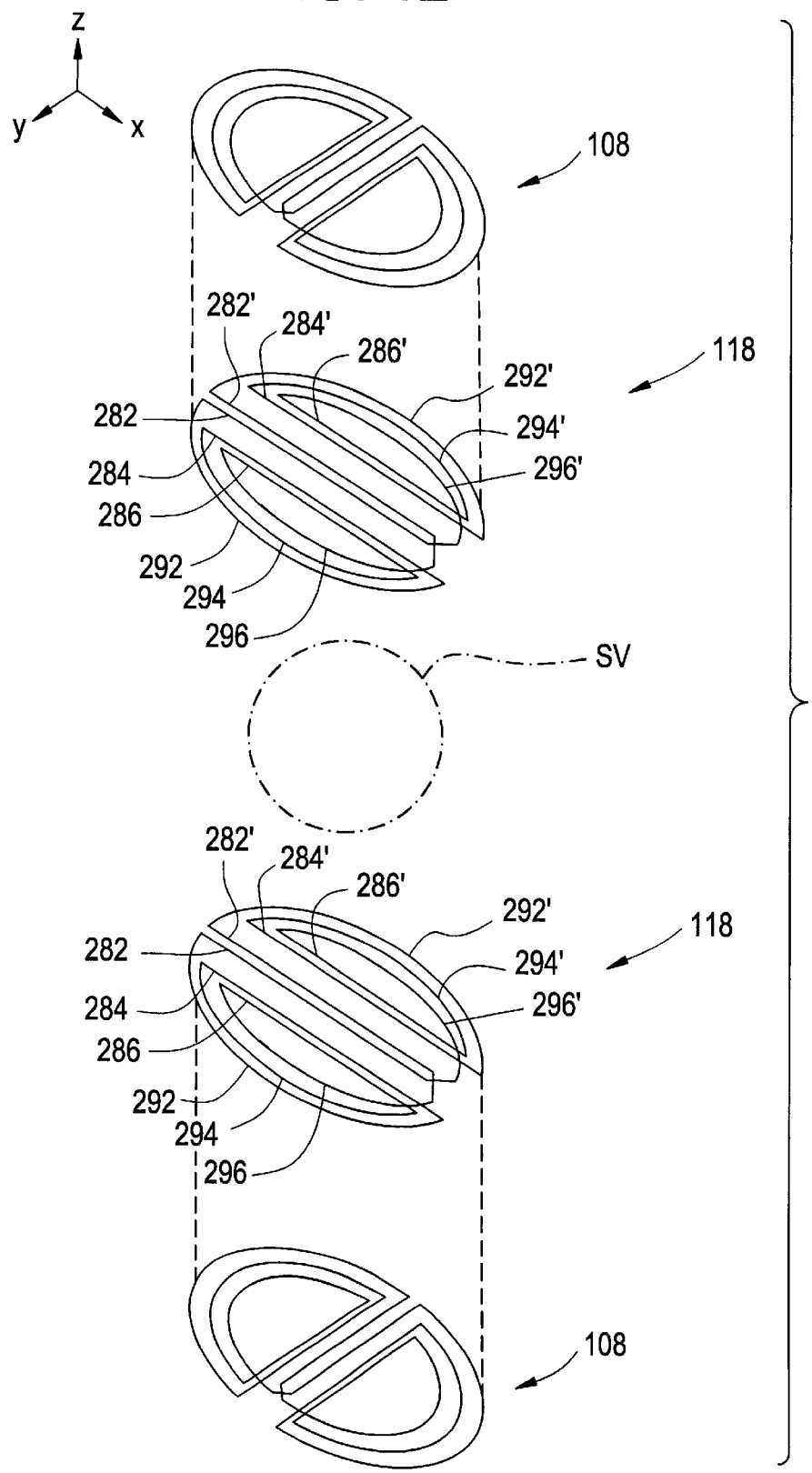
FIG. 12 is a schematic illustration showing patterns of current passes for the transmission coil units shown in FIG. 7.

As shown in FIG. 12 by way of example, a pair of transmission coil units 108 having such coil patterns are opposed to each other with an imaging or spheric volume SV interposed therebetween together with one transmission coil unit 108. The pair of transmission coil units 118 is supplied with drive signals opposite in phase to each other. Thus, the fields developed in the pair of transmission coil units 118 is applied to the shooting or spheric volume SV.

Main passes 282, 284 and 286 for one of the pair of transmission coil units 118 show one example illustrative of an embodiment of a seventh current pass group employed in the present invention, main passes 282', 284' and 286' for one thereof show one example illustrative of an embodiment of an eighth current pass group employed in the present invention, and return passes 292, 294, 296, 292', 294' and 296' for one thereof show one example illustrative of an embodiment of a ninth current pass group employed in the present invention.

Main passes 282, 284 and 286 for the other of the pair of transmission coil units 118 show one example illustrative of an embodiment of a tenth current pass group employed in the present invention, main passes 282', 284' and 286' for the other thereof show one example illustrative of an embodiment of an eleventh current pass group employed in the present invention, and return passes 292, 294, 296, 292', 294' and 296' for the other thereof show one example illustrative of an embodiment of a twelfth current pass group employed in the present invention.

A drive signal for the transmission coil unit 108 and a drive signal for the transmission coil unit 118 are different 90° in phase from each other. Thus, the transmission coils 108 and the transmission coil units 118 perform so-called quadrature operations to produce high-frequency magnetic fields turned within an xy plane in the imaging or spheric volume SV.

While the example of the RF coil dedicated for transmission has been described above, art RF coil perfectly identical in configuration to this coil can also be used for reception of a magnetic resonance signal. In that case, receive signals are captured from both ends of capacitors 402 and 302. Incidentally, the uniformization of the strength of a magnetic field developed in a transmission coil is equivalent to the uniformization of the distribution of sensitivity in a receiving coil.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil having a generally flat planar shape and comprising:

a first group of conductive wires consisting of a first plurality of straight conductive wires disposed generally on first planar surface in parallel with one another;

a second group of conductive wires consisting of a second plurality of straight conductive wires equal in number to said first plurality and being disposed in parallel to one another and generally on said first planar surface so as to have a mirror image parallel to said first group of conductive wires;

a third group of conductive wires consisting of a third plurality of circular conductive wires equal in number to a sum of said first plurality and said second plurality, each circular conductive wire of said third plurality being separately connected, respectively, by one end to a respective one end of each separate straight conductive wire of said first and second pluralities; and means for serially connecting said first, second and third group of conductive wires so that current applied to said first, second and third group of conductive wires results in identical current flow directions through both said straight conductive wires of said first and second conductive groups of wires.

2. The coil of claim further comprising:
a fourth group of conductive wires consisting of a fourth plurality of straight conductive wires disposed generally on a second planar surface opposed in parallel to said first planar surface with a space interposed therebetween so that said straight conductive wires of said fourth group of conductive wires extend parallel to each other and parallel to said straight conductive wires of said first group of conductive wires;
a fifth group of conductive wires consisting of a fifth plurality of straight wires equal in number to said fourth plurality and being disposed parallel to one another and generally on said second planar surface so as to have a mirror image parallel to said fourth group of conductive wires;
a sixth group of conductive wires consisting of a sixth plurality of circular conductive wires equal in number to a sum of said fourth plurality and said fifth plurality, each circular conductive wire of said sixth plurality being separately connected, respectively, by one end to a respective one end of each separate straight conductive wire of said fourth and fifth pluralities; and
means for serially connecting said fourth, fifth and sixth group of conductive wires so that current applied to said fourth, fifth and sixth group of conductive wires results in identical current flow directions through both said straight conductive wires of said fourth and fifth group of conductive wires.

3. The coil of claim 2, further comprising:
a seventh group of conductive wires consisting of a seventh plurality of straight conductive wires disposed generally on a third planar surface adjacent to said first planar surface and opposed in parallel therewith so as to extend parallel to one another along a direction orthogonal to direction the straight conductive wires of said first group of conductive wires extend;
an eighth group of conductive wires consisting of an eighth plurality of straight conductive wires equal in number to said seventh plurality and being disposed parallel to one another and generally on said third planar surface so as to have a mirror image parallel to said seventh group of conductive wires;
a ninth group of conductive wires consisting of a ninth plurality of circular conductive wires equal in number to a sum of said seventh plurality and eighth plurality, each circular conductive wire of said ninth plurality being separately connected, respectively, by one end to a respective one end of each separate straight conductive wire of said seventh and eighth pluralities; and
means for serially connecting said seventh, eighth and ninth group of conductive wires so that current applied to said seventh, eighth and ninth group of conductive wires results in identical current flow directions through both said straight conductive wires of said seventh and eighth conductive wires.

4. The coil of claim 3, further comprising:
a tenth group of conductive wires consisting of a tenth plurality of straight wires disposed generally on a fourth planar surface adjacent to said second planar surface and opposed in parallel therewith so as to extend parallel to one another along a direction orthogonal to the direction the straight conductive wires of said fourth group of conductive wires extend;
an eleventh group of conductive wires consisting of an eleventh plurality of straight wires equal in number to said tenth plurality and being disposed parallel to one another and generally on said fourth planar surface so as to have a mirror image parallel to said tenth group of conductive wires;
a twelfth group of conductive wires consisting of a twelfth plurality of circular conductive wires equal in number to a sum of said tenth plurality and said eleventh plurality, each circular conductive wire of said twelfth plurality being separately connected, respectively, by one end to a respective one end of each separate straight conductive wire of said tenth and eleventh pluralities; and
means for serially connecting said tenth, eleventh and twelfth group of conductive wires so that current applied to tenth, eleventh and twelfth group of conductive wires results in identical current flow directions through both said straight conductive wires of said tenth and eleventh group of conductive wires.

5. A magnetic resonance imaging system for forming an image based on magnetic resonance signals acquired using a static magnetic field, a gradient magnetic field, and a high frequency magnetic field, said system comprising an RF coil having a generally flat planar shape and for generating said high frequency magnetic field, said RF coil comprising:
a first group of conductive wires consisting of a first plurality of straight conductive wires disposed generally on a first planar surface in parallel with one another;
a second group of conductive wires consisting of a second plurality of straight conductive wires equal in number to said first plurality and being disposed in parallel with one another and generally on said first planar surface so as to have a mirror image parallel to said first group of conductive wires;
a third group of conductive wires consisting of a third plurality of circular conductive wires equal in number to a sum of said first plurality and said second plurality , each circular conductive wire of said third plurality being separately connected, respectively, by one end to a respective one end of each separate straight conductive wire of said first and second pluralities; and
means for serially connecting said first, second and third group of conductive wires so that current applied to said first, second and third group of conductive wires results in identical current flow directions through both said straight conductive wires of said first and second conductive groups of wires.

6. The system of claim 5, wherein said RF coil further comprises:
a fourth group of conductive wires consisting of a fourth plurality of straight conductive wires disposed generally on a second planar surface opposed in parallel to said first planar surface with a space interposed therebetween so that said straight conductive wires of said fourth group of conductive wires extend parallel to each other and parallel to said straight conductive wires of said first group of conductive wires;
a fifth group of conductive wires consisting of a fifth plurality of straight wires equal in number to said fourth plurality and being disposed parallel to one another and generally on said second planar surface so as to have a mirror image parallel to said fourth group of conductive wires;
a sixth group of conductive wires consisting of a sixth plurality of circular conductive wires equal in number to a sum of said fourth plurality and said fifth plurality, each circular conductive wire of said sixth plurality being separately connected, respectively, by one end to a respective one end of each separate straight conductive wire of said fourth and fifth pluralities; and means for serially connecting said fourth, fifth and sixth group of conductive wires so that current applied to said fourth, fifth and sixth group of conductive wires results in identical current flow direction through both said straight conductive wires of said fourth and fifth group of conductive wires.

7. The system of claim 6, wherein said RF coil further comprises:

a seventh group of conductive wires consisting of a seventh plurality of straight conductive wires disposed generally on a third planar surface adjacent to said first planar surface and opposed in parallel therewith so as to extend parallel to one another along a direction orthogonal to direction the straight conductive wires of said first group of conductive wires extend;

an eighth group of conductive wires consisting of an eighth plurality of straight conductive wires equal in number to said seventh plurality and being disposed parallel to one another and generally on said third planar surface so as to have a mirror image parallel to said seventh group of conductive wires;

a ninth group of conductive wires consisting of a ninth plurality of circular conductive wires equal in number to a su of said seventh plurality and eighth plurality, each circular conductive wire of said ninth plurality being separately connected, respectively, by one end to a respective one end of each separate straight conductive wire of said seventh and eighth pluralities; and means for serially connecting said seventh, eighth and ninth group of conductive wires so that current applied to said seventh, eigth and ninth group of conductive wires results in identical current flow directions through both said straight conductive wires of said seventh and eighth conductive wires.

8. The system of claim 7, wherein said RF coil further comprises:

a tenth group of conductive wires consisting of a tenth plurality of straight wires disposed generally on a fourth planar surface adjacent to said second planar surface and opposed in parallel therewith so as to extend parallel to one another along a direction orthogonal to the direction the straight conductive wires of said fourth group of conductive wires extend;

an eleventh group of conductive wires consisting of an eleventh plurality of straight wires equal in number to said tenth plurality and being disposed parallel to one another and generally on said fourth planar surface so as to have a mirror image parallel to said tenth group of conductive wires;

a twelfth group of conductive wires consisting of a twelfth plurality of circular conductive wires equal in number to a sum of said tenth plurality and said eleventh plurality, each circular conductive wire of said twelfth plurality being separately connected, respectively, by one end to a respective one end of each separate straight conductive wire of said tenth and eleventh pluralities; and means for serially connecting said tenth, eleventh and twelfth group of conductive wires so that current applied to said tenth, eleventh and twelfth group of conductive wires results in identical current flow directions through both said straight conductive wires of said tenth and eleventh group of conductive wires.

* * * * *